(12) United States Patent
Robert et al.

(10) Patent No.: US 10,355,651 B2
(45) Date of Patent: Jul. 16, 2019

(54) AMPLIFIER AND A WIRELESS SIGNAL RECEIVER COMPRISING SAID AMPLIFIER

(71) Applicant: NXP B.V., Eindhoven (NL)

(72) Inventors: Sebastien Robert, Emieville (FR); Guy Le Moal, Rots (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/040,630

(22) Filed: Jul. 20, 2018

(65) Prior Publication Data

US 2019/0089315 A1 Mar. 21, 2019

(30) Foreign Application Priority Data

Sep. 20, 2017 (EP) .................................... 17306232

(51) Int. Cl.
*H04W 88/02* (2009.01)
*H03K 19/096* (2006.01)
(Continued)

(52) U.S. Cl.
CPC .............. *H03F 1/56* (2013.01); *H03F 1/0205* (2013.01); *H03F 1/26* (2013.01); *H03F 3/189* (2013.01);
(Continued)

(58) Field of Classification Search
CPC ......... H03F 3/193; H03F 3/68; H04B 1/0053; H04W 88/02
(Continued)

(56) References Cited

U.S. PATENT DOCUMENTS 5,554,951 A * 9/1996 Gough .................... H03F 3/005
327/337
6,346,903 B1 * 2/2002 Messager ............. G09G 3/3696
341/154
(Continued)

FOREIGN PATENT DOCUMENTS

EP 2110947 A1 10/2009

OTHER PUBLICATIONS

Yang et al., "A +8dBm BLE/BT Transceiver with Automatically Calibrated Integrated RF Bandpass Filter and -58dBc TX HD2," IEEE International Solid-State Circuits Conference 2017 / Session 7 / Wireless Transceivers / 7.6, pp. 136-138.
(Continued)

*Primary Examiner* — Tan H Trinh (57) ABSTRACT

An amplifier includes a supply voltage terminal and a reference voltage terminal and an input terminal. An amplifier arrangement includes a first and second branch coupled between the supply and reference voltage terminals, and one or more transistors configured to provide current flow through each of the branches based on the input signal at the input terminal. A first output terminal is coupled to the first branch to provide a first output signal based on the current flow therethrough. A second output terminal is coupled to the second branch to provide a second output signal based on the current flow therethrough. An impedance-modifying circuit is coupled to the second output terminal to provide a voltage variation in the second output signal in response to the input signal greater than a voltage variation in the first output signal in response to the input signal.

15 Claims, 4 Drawing Sheets

(51) Int. Cl.

| | | |
|---|---|---|
| *H03F 1/56* | (2006.01) | |
| *H03F 3/45* | (2006.01) | |
| *H04B 1/16* | (2006.01) | |
| *H03F 1/02* | (2006.01) | |
| *H03F 3/193* | (2006.01) | |
| *H03F 1/26* | (2006.01) | |
| *H03F 3/189* | (2006.01) | |
| *H03F 3/68* | (2006.01) | |

(52) U.S. Cl.
CPC ......... *H03F 3/193* (2013.01); *H03F 3/45475* (2013.01); *H03F 3/68* (2013.01); *H04B 1/16* (2013.01); *H03F 2200/129* (2013.01); *H03F 2200/144* (2013.01); *H03F 2200/222* (2013.01); *H03F 2200/294* (2013.01); *H03F 2200/324* (2013.01); *H03F 2200/372* (2013.01); *H03F 2200/387* (2013.01); *H03F 2200/451* (2013.01); *H03F 2200/465* (2013.01); *H03F 2203/45116* (2013.01)

(58) Field of Classification Search
USPC .... 455/73, 341, 334, 355, 572; 330/51, 136; 327/337, 512, 509
See application file for complete search history.

(56) References Cited

U.S. PATENT DOCUMENTS

| | | | | |
|---|---|---|---|---|
| 6,388,526 B1* | 5/2002 | Daniel | ................. | H03G 3/3068 |
| | | | | 330/136 |
| 6,473,340 B1* | 10/2002 | Pasotti | ................. | G11C 11/5642 |
| | | | | 365/185.03 |
| 8,653,885 B2* | 2/2014 | Fort | ................. | G05F 3/30 |
| | | | | 327/512 |
| 2005/0083117 A1* | 4/2005 | Kim | ................. | H03F 1/0211 |
| | | | | 330/51 |
| 2007/0285131 A1* | 12/2007 | Sohn | ................. | G11C 7/02 |
| | | | | 326/95 |
| 2009/0091384 A1* | 4/2009 | Sorrells | ................. | H03F 1/0272 |
| | | | | 330/207 R |
| 2009/0186592 A1 | 7/2009 | Ikeda et al. | | |
| 2013/0335135 A1* | 12/2013 | Chen | ................. | H04L 25/0272 |
| | | | | 327/509 |
| 2014/0134960 A1* | 5/2014 | Tasic | ................. | H03F 3/193 |
| | | | | 455/73 |
| 2015/0171798 A1 | 6/2015 | Syed et al. | | |
| 2017/0093349 A1* | 3/2017 | Elliott | ................. | H03F 1/0233 |
| 2017/0146591 A1 | 5/2017 | Nobbe et al. | | |
| 2017/0187338 A1* | 6/2017 | Wang | ................. | H03F 1/565 |
| 2017/0294889 A1* | 10/2017 | Pavao-Moreira | ................. | |
| | | | | H03K 19/018585 |

OTHER PUBLICATIONS

Perin et al, "Low-power digitally-controlled variable gain attenuator and LNA with high gain dynamic range for sub-GHz ISM bands," Analog Integrated Circuits arid Signal Processing, 2012, An International Journal, ISSN 0925-1030, vol. 73, No. 1, 17 pages.

Borremans et al, "A switchable low-area 2.4- and -5 GHz dual-band LNA in digital CMOS", 33rd European Solid State Circuits Conference, Sep. 1, 2007, pp. 376-379.

NXP Semiconductors, "Wi-Fi Coexistence benchmark, Technical report," Rev. 1.0, Jun. 2, 2017, 20 pages.

Silicon Labs / EFR32MG1 / Mighty Gecko ZigBee® & Thread SoC Family Data Sheet, silabs.com, Dated Jan. 12, 2016 (on document p. 96), Preliminary Rev. 0.9, 102 pages.

* cited by examiner

AMPLIFIER AND A WIRELESS SIGNAL RECEIVER COMPRISING SAID AMPLIFIER

CROSS-REFERENCE TO RELATED APPLICATIONS

This application claims priority under 35 U.S.C. § 119 to European patent application no. EP 17306232.4, filed Sep. 20, 2017, the contents of which are incorporated by reference herein.

The present disclosure relates to an amplifier and a wireless signal receiver comprising said amplifier. In particular, it relates to an amplifier having a first output terminal providing a first output signal having a first voltage variation based on an input signal and a second output terminal providing a second output signal having a second voltage variation wherein the voltage variation at the second output terminal in response to the input signal is greater than the first voltage variation at the first output terminal in response to the input signal by virtue of an impedance-modifying circuit.

According to a first aspect of the present disclosure there is provided an amplifier comprising:
  a supply voltage terminal for receiving a supply voltage;
  a reference voltage terminal for receiving a reference voltage;
  an input terminal configured to receive an input signal for amplification by the amplifier;
  an amplifier arrangement comprising at least a first branch and a second branch coupled between the supply voltage terminal and the reference voltage terminal, the amplifier arrangement further comprising one or more transistors configured to provide current flow through each of the first and second branches based, at least in part, on the input signal at the input terminal;
  a first output terminal coupled to a first node in the first branch configured to provide a first output signal based, at least in part, on the current flow therethrough; and
  a second output terminal coupled to a second node in the second branch configured to provide a second output signal based, at least in part, on the current flow therethrough, wherein an impedance-modifying circuit is coupled to the second output terminal and configured to provide a voltage variation in the second output signal in response to the input signal such that the voltage variation in the second output signal is greater than a voltage variation in the first output signal in response to the input signal.

In one or more embodiments, the first branch of the amplifier arrangement comprises a first transistor coupled to the input terminal to receive the input signal and coupled in series with a first load, the first transistor and first load configured to provide the first output signal in response to the input signal;
  the second branch of the amplifier arrangement comprises a second transistor coupled with the input terminal to receive the input signal and coupled in series with a second load; and wherein
  the first node is arranged between the first load and the first transistor to provide the first output signal to the first output terminal; and
  the second node is arranged between the second load and the second transistor and configured to provide the second output signal modified by the impedance-modifying circuit.

In one or more examples, the first branch comprises the first load coupled in series with the first transistor by its source and drain terminals, the input signal provided to a gate terminal of the first transistor. In one or more examples, the second branch comprises the second load coupled in series with the second transistor by its source and drain terminals, the input signal provided to the gate terminal of the second transistor.

In one or more embodiments, the amplifier arrangement comprises:
  a common transistor coupled to the input terminal to receive the input signal and coupled to both the first and second branches, the first branch having a first-branch transistor and a first-branch load arranged in series and the second branch having a second-branch transistor and a second-branch load arranged in series; and wherein
  the first node is arranged between the first-branch load and the first-branch transistor to provide the first output signal; and
  the second node is arranged between the second-branch load and the second-branch transistor to provide the second output signal modified by the impedance-modifying circuit.

In one or more examples, the second output terminal provides the second output signal for automatic gain control. In one or more examples, the first output terminal provides the first output signal for provision to a mixer.

In one or more examples, the common transistor is configured to receive the input signal at its gate terminal, the first and second branches are coupled to its source terminal and its drain terminal is coupled to the reference voltage terminal.

In one or more embodiments, the impedance-modifying circuit comprises one or more of;
  a) a load coupled between the second output and one of the reference voltage terminal and the supply voltage terminal, and in parallel with the second output;
  b) a feedback impedance coupled between the input terminal and the second output terminal.

In one or more embodiments, a) the first transistor and the second transistor or b) the first-branch transistor and the second-branch transistor are one of:
  i) nmos type; and
  ii) pmos type.

In one or more embodiments, when the first and second transistors are of nmos type, the first load is coupled between the supply voltage terminal and the first transistor, and the first transistor is coupled between the first load and the reference voltage terminal; and
  wherein the second load is coupled between the supply voltage terminal and the second transistor, and the second transistor is coupled between the second load and the reference voltage terminal.

In one or more embodiments, when the first and second transistors are of pmos type, the first transistor is coupled between the supply voltage terminal and the first load and the first load is coupled between the first transistor and the reference voltage terminal; and
  wherein the second transistor is coupled between the supply voltage terminal and the second load and the second load is coupled between the second transistor and the reference voltage terminal.

In one or more embodiments, the first transistor and the second transistor have different sizes.

In one or more examples, the first-branch transistor and the second-branch transistor have different sizes. In one or more examples, a gate terminal of both the first-branch transistor and the second-branch transistor is configured to receive a bias voltage.

In one or more embodiments, the first load and the second load comprise one or more of;
 i) one or more resistors;
 ii) one or more inductors;
 iii) one or more LC circuits comprising a capacitor in parallel with an inductor;
 iv) one or more transistors.

In one or more examples, the first-branch load and the second-branch load comprise one or more of;
 i) one or more resistors;
 ii) one or more inductors;
 iii) one or more LC circuits comprising a capacitor in parallel with an inductor;
 iv) one or more transistors.

In one or more embodiments, the impedance-modifying circuit comprises a load coupled between the second output and one of the reference voltage terminal and the supply voltage terminal and in parallel with the second output, the load comprising one or more of;
 i) one or more resistors in series with one or more capacitors;
 ii) one or more inductors; and
 iii) one or more capacitors.

In one or more embodiments, the input terminal of the amplifier is coupled to a matching impedance coupled in parallel, the matching impedance configured to match the input impedance of the amplifier to the impedance of a block providing the input signal.

In one or more embodiments, the amplifier arrangement comprises:
 a first common transistor coupled to the input terminal to receive the input signal and coupled to both the first and second branches, the first branch having a third transistor and a fifth transistor arranged in series and the second branch having a fourth transistor and a sixth transistor arranged in series; and wherein
 the first node is arranged between the third transistor and the fifth transistor and configured to provide the first output signal; and
 the second node is arranged between the fourth transistor and the sixth transistor and configured to provide the second output signal modified by the impedance-modifying circuit.

In one or more examples, the third transistor in the first branch and the fourth transistor in the second branch form a first current splitter, and the fifth transistor in the first branch and the sixth transistor in the second branch form a second current splitter.

In one or more examples, the third and fourth transistors are configured to both receive a first bias voltage.

In one or more examples, the fifth and sixth transistors are configured to both receive a second bias voltage.

In one or more embodiments, the amplifier arrangement includes a second common transistor coupled to the input terminal and coupled to both the first and second branches to control the current to the first and second branches in response to the input signal.

In one or more examples, the second common transistor is a pmos transistor. In one or more examples, the second common transistor is configured to receive the input signal at its gate terminal and couples between the supply voltage terminal at a source terminal and to the first and second branches as the drain terminal.

According to a second aspect we provide a wireless signal receiver comprising the amplifier of the first aspect, the receiver configured to receive a wireless signal and provide said received signal to the input terminal for amplification by the amplifier, the receiver comprising a wireless signal power detector coupled to the second output terminal and a mixer coupled to the first output terminal for processing of the received signal.

In one or more examples, the power detector is configured to provide a feedback signal for automatic gain control of the amplification provided by one or more of the amplifier and any other amplifier of the wireless signal receiver.

In one or more embodiments, the receiver is configured to provide for processing of wireless signal in accordance with one or more of the IEEE 802.15.4 standard, IEEE 802.11 standard and the Bluetooth Low Energy standard.

In one or more embodiments, an output of the mixer is electrically coupled to an input node of a trans-impedance amplifier, the trans-impedance amplifier having an output node to provide an amplified output signal based on an input signal received at the input node from the mixer, the trans-impedance amplifier having a feedback network coupled between the output node and the input node of the trans-impedance amplifier.

According to a further aspect we provide an electronic device including the wireless signal receiver according to the second aspect, the electronic device comprising any one of: a mobile telephone, a computer, a tablet computer, a wearable device, a sensor, a wireless headset.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

One or more embodiments will now be described by way of example only with reference to the accompanying drawings in which.

Wireless signal receivers may receive unwanted signals in addition to the signals they are configured to receive. The interference caused by unwanted signals may degrade the performance of the wireless signal receiver. As an example, wireless signal receivers for receiving wireless signals in accordance with Bluetooth Low Energy and IEEE 802.15.4 standards, such as Zigbee, Snap, Thread, 6LoWPAN signals may suffer interference from WiFi signals. The ability to receive a weak but wanted signal in the 2.4 GHz ISM band in the presence of a strong WiFi interferer is becoming an important feature of wireless signal receivers.

The immunity of a wireless signal receiver to an unwanted, interference signal, can be divided in two main parts:

The intrinsic performances of the receiver in term of one or more of noise, linearity and phase noise; and The ability of an automatic gain control (AGC) system to identify the presence of the unwanted signal, and to react in a fast way to adjust the gain of one or more amplifiers of the wireless signal receiver in order to be able to receive the wanted signal even with the presence of a strong unwanted signal. The AGC may adjust the gain of one or more amplifiers of the wireless signal receiver in order to place the receiver in a state that corresponds to an advantageous trade-off between noise and linearity. The effective operation of an automatic gain control system may require an effective determination of wireless signal power, which may require a power detector that is provided with an appropriate input signal representative of the wireless signal received by the receiver.

In the examples that follow, various embodiments of an amplifier 101 and the associated impedance-modifying-circuit (shown as impedance 120 in FIG. 1) that may form part of a wireless signal receiver 100 will be described. In general, the example amplifier comprises an input terminal 102 for receiving an input signal and two output terminals 103, 104 each providing an amplified signal based on the input signal, wherein the first output terminal 103 operates in a current mode and the second output terminal 104 operates in a voltage mode. Accordingly, the amplifier 101 may be configured such that the first output terminal provides a greater variation in current output for a given input signal than the second output, which may provide an input signal to a mixer 105 (for demodulation and any other signal processing). The amplifier 101 may be configured such that the second output terminal provides a greater variation in voltage output for a given input signal than the first output terminal which may provide an input signal to a power level detector 106, such as for automatic gain control. The impedance-modifying circuit 120 may be configured to provide the desired difference in voltage variation provided at the first and second output terminals for a given input signal to the amplifier. The power level detector 106 may provide signalling indicative of the detected power level for control of the gain of the amplifier 101 and/or an amplifier 107 and/or any other amplifier that may form part of the receiver 100.

Figure 1:
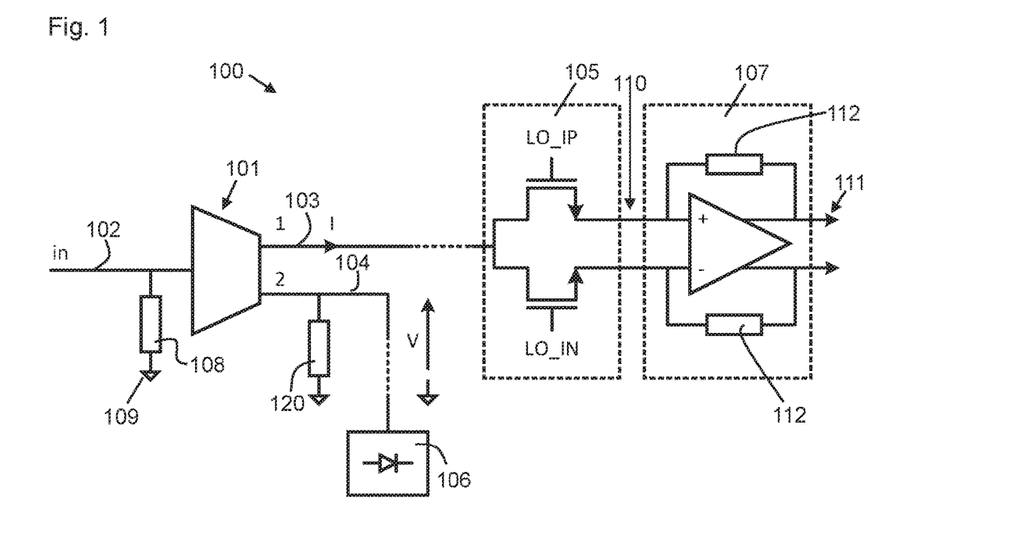
FIG. 1 shows an example embodiment of an amplifier having first and second output terminals, wherein one is operating in current mode and the other one is operating in voltage mode, the amplifier is shown as part of a wireless communication receiver.

FIG. 1 shows at least part of an example wireless signal receiver 100 comprising the amplifier 101. The amplifier 101 may comprise a low noise amplifier (LNA) for the receiver 100 and may provide its first output signal from the first output node 103 to the mixer 105 and the second output signal from the second output node 104 to the power level detector 106. The power level detector 106 may be configured to determine the voltage of the second output signal at the second output node, which may be indicative of wireless signal power. The mixer 105 may be coupled to the further amplifier 107, which may comprise a differential amplifier.

The input terminal 102 of the amplifier 101 may be coupled, in parallel, to a matching impedance 108. The matching impedance 108 may be coupled between the input node 102 and a reference voltage, such as ground 109. The matching impedance may be configured to input-impedance match the amplifier 101 to the output impedance of a block (not shown), such as an antenna, preceding the amplifier 101.

The following examples of FIGS. 2 to 8 show different example implementations of the amplifier 101.

Figure 2:
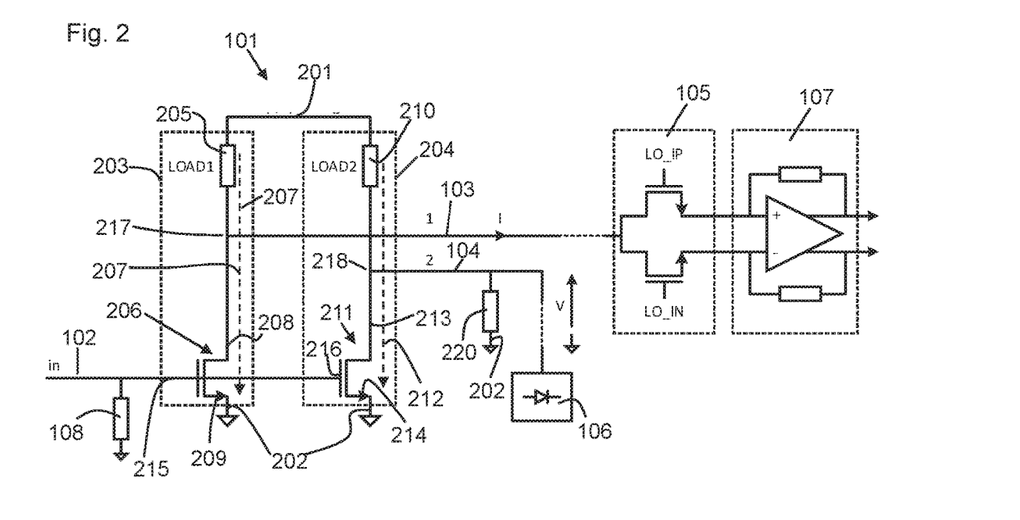
FIG. 2 shows a first example embodiment of the structure of the amplifier.

With reference to FIG. 2, the amplifier 101 comprises a supply voltage terminal 201 for connection to a supply voltage and a reference voltage terminal 202 for connection to a reference voltage, such as ground. The amplifier 101 comprises an amplifier arrangement comprising a first branch 203 and a second branch 204. The first and second branches 203, 204 are each coupled between the supply voltage terminal 201 and the reference voltage terminal 202 providing parallel paths between the supply terminal 201 and the reference terminal 202.

The amplifier arrangement includes components, embodiments of which are described below, configured to provide current flow through each of the first and second branches 203, 204 based, at least in part, on the input signal at the input terminal 102.

In this example, the first branch 203 comprises a first load 205 coupled in series with a first transistor 206 to define a current path (shown by dashed line 207 by the side of the components) through the first load 205 and the first transistor 206 via its source 208 and drain 209 terminals. In this example, the first load 205 has a first terminal coupled to the supply voltage terminal 201 and a second terminal coupled to the first transistor 206. In this example, the first transistor 206 is coupled by its source terminal 208 to the first load 205 and by its drain terminal 209 to the reference voltage terminal 202.

In this example, the second branch 204 comprises a second load 210 coupled in series with a second transistor 211 to define a current path (shown by dashed line 212 by the side of the components) through the second load 210 and the second transistor 211 via its source 213 and drain terminals 214. In this example, the second load 204 has a first terminal coupled to the supply voltage terminal 201 and a second terminal coupled to the second transistor 211. In this example, the second transistor 211 is coupled by its source terminal 213 to the second load 210 and by its drain terminal 214 to the reference voltage terminal 202.

The input terminal 102 of the amplifier 101 is configured to receive an input signal for amplification by the amplifier 101. The input node 102 is coupled to a respective gate terminal 215, 216 of both the first transistor 206 and the second transistor 211.

The first output terminal 103 of the amplifier 101 is, in this example, coupled to a node 217 in the first branch between the first load 205 and the first transistor 206. The second output terminal 104 is, in this example, coupled to a node 218 in the second branch between the second load 210 and the second transistor 211.

An impedance-modifying circuit 220 is coupled to the second output terminal 104 such that the second output signal at the second output terminal has a greater voltage variation for a given input signal than the voltage variation of the first output signal at the first output terminal 103.

The current variation of the first output signal at the first output terminal may be greater than the current variation of the second output signal at the second output terminal for a given input signal.

Accordingly, such an arrangement provides an amplifier arrangement able to drive a mixer 105 having a low input impedance via the first output terminal 103 and a power level detector 106 having a high input impedance via the second output terminal 104. The impedance-modifying circuit 220 in this example comprises a load 220 coupled in parallel with the second output 104 and coupled between the second output terminal 104 and a reference voltage terminal, which may comprise ground. In other examples the load 220 may be coupled between the second output terminal 104 and a supply voltage terminal, such as terminal 201.

The first output terminal 103 can be considered to provide a current drive and the second output 104 can be considered to provide a voltage drive. In particular, in one or more examples, the impedance of the first load 205 ($Z_{LOAD1}$) is greater than, preferably much greater than, the impedance of the mixer ($Z_{mixer}$) which is to be coupled to the first output 103, i.e. $Z_{LOAD1} \gg Z_{mixer}$. Further, the impedance of the second load 210 ($Z_{LOAD2}$) is greater than, preferably much greater than, the impedance of the load 220 ($Z_{OIMC\_LOAD}$), i.e. $Z_{LOAD2} \gg Z_{OIMC\_LOAD}$. Further, the impedance of the load 220 ($Z_{OIMC\_LOAD}$) is greater than, preferably much greater than the impedance of the mixer ($Z_{mixer}$) which is to be coupled to the first output 103, $Z_{OIMC\_LOAD} \gg Z_{mixer}$. Further, $Z_{OIMC\_LOAD} \ll Z\text{in\_det}$, wherein Zin_det is the input impedance of the detector, and thus the load at the second output terminal 104.

The example amplifier 101 of FIG. 2 may be formed using a replica technique and/or a CMOS deep sub-micron technique. The first and second transistors 206, 211 may comprise transistors of NMOS type.

It will be appreciated that while in this example and the examples that follow only one load 205, 210 and transistor 206, 211 arrangement is shown in each of the branches 203, 204, the branches 203, 204 may include one or more of such load/transistor arrangements in parallel. An amplification ratio n/m may be achieved by connecting different numbers of transistors in parallel in each of the two branches 203, 204. This ratio may be used to improve or optimize the power consumption of the amplifier 101.

Figure 3:
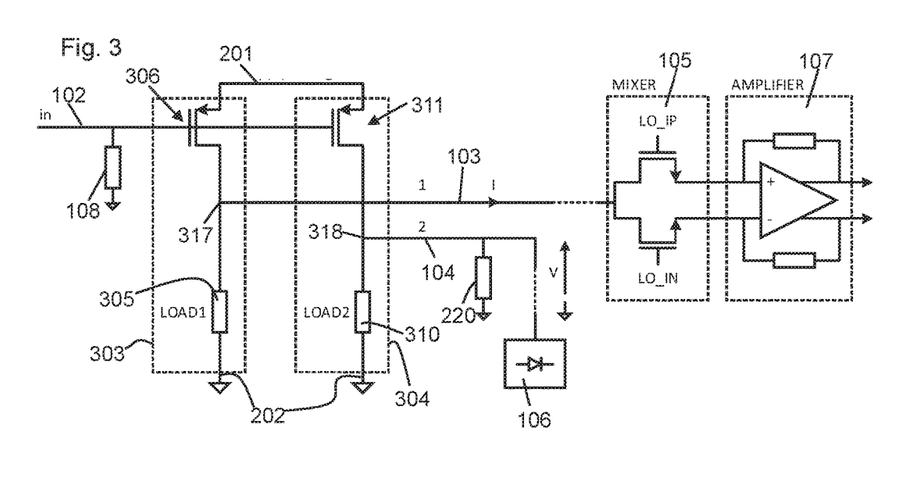
FIG. 3 shows a second example embodiment of the structure of the amplifier.

FIG. 3 shows a second example embodiment of the amplifier 101. In this example, the receiver 100 is substantially similar to the example shown in FIG. 2 and the same reference numerals have been used. However, in this example, the first transistor 306, and the second transistor 311 are of PMOS type. Further, in this example, the first transistor 306 (via source and drain terminals thereof) is coupled between the supply voltage terminal 201 and the first load 305 and the first load 305 is coupled between the first transistor 306 and the reference voltage terminal 202. Further, in this example, the second transistor 311 (via source and drain terminals thereof) is coupled between the supply voltage terminal 201 and the second load 310 and the second load 310 is coupled between the second transistor 311 and the reference voltage terminal 202. The first output terminal 103 as in the example of FIG. 2 is provided from a node 317 between the first transistor 306 and the first load 305 and the second output 104 is provided from a node 318 between the second transistor 311 and the second load 310. The input signal received at input node 102 is applied to the gate terminal of the first, pmos, transistor 306 and the gate terminal of the second, pmos, transistor 311. The input signal thus controls the current flow through the first branch 303 and the second branch 304.

The remainder of the example of FIG. 3 is substantially the same as the example of FIG. 2. Thus, the amplifier arrangement may be formed with nmos or pmos transistor arrangements in the branches.

Figure 4:
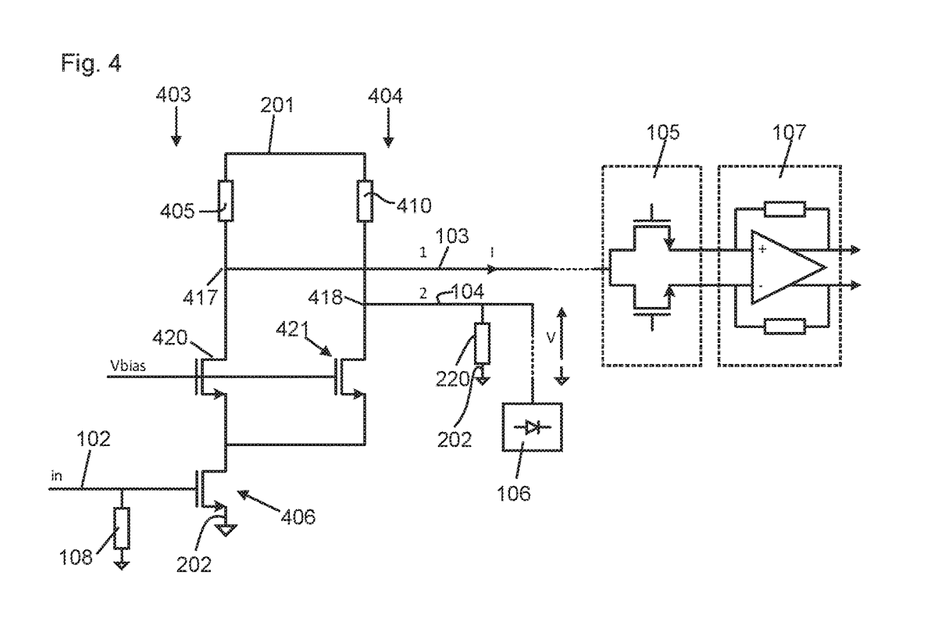
FIG. 4 shows a third example embodiment of the structure of the amplifier.

FIG. 4 shows a third example embodiment configured to provide the desired output signals and an alternative amplifier arrangement is provided. In this example, the amplifier arrangement comprises a first common transistor 406 provided with a current splitter arrangement formed of the first and second branches 403, 404. The current splitter can be considered to comprise the two branches 403 and 404. The common transistor 406 provides for control of the current through the current splitter/branches in response to the input signal. In the example of FIG. 4, the first branch 403 is coupled to a terminal (e.g. source terminal) of the common transistor 406 and the second branch 404 is coupled to the same terminal of the common transistor 406. The first branch 403 includes a first-branch transistor 420 and a first-branch load 405, the first-branch transistor in cascode with the common transistor 406. The second branch 404 includes a second-branch transistor 421 and a second-branch load 410, the second-branch transistor in cascode with the common transistor 406.

Thus, in this example, the first branch 403 comprises the first-branch load 405 coupled to the supply voltage terminal 201 by a first terminal and to a source terminal of the first-branch transistor 420 by a second terminal. The drain terminal of the first-branch transistor 420 is coupled to the source terminal of the common transistor 406. The drain terminal of the common transistor 406 is coupled to the reference voltage terminal 202.

Likewise, in this example, the second branch 404 comprises the second-branch load 410 coupled to the supply voltage terminal 201 by a first terminal and to a source terminal of the second-branch transistor 421 by a second terminal. The drain terminal of the second-branch transistor 421 is coupled to the source terminal of the common transistor 406. The drain terminal of the common transistor 406 is coupled to the reference voltage terminal 202, as mentioned above.

A gate terminal of the common transistor 406 is, in this example, coupled to the input terminal 102. The first output terminal 103 may be coupled to a node 417 between the first-branch load 405 and the first-branch transistor 420. The second output terminal 104 may be coupled to a node 418 between the second-branch load 410 and the second-branch transistor 421.

The gate terminals of both the first-branch transistor 420 and the second-branch transistor 421 is configured to receive a bias voltage, Vbias.

The common transistor 406 controls a current flow through the branches based on the input signal. If the cascode, first-branch and second-branch transistors 420 and 421 are of equal size then both currents flowing into the two branches 403 and 404 are identical. If the transistors 420 and 421 have a different size such as in a ratio n/m, like in this example, then the currents flowing into the two branches 403 and 404 will also have a ratio n/m.

The first output terminal 103 can be considered to provide a current drive and the second output terminal 104 can be considered to provide a voltage drive. In particular, the impedance of the first-branch load 405 ($Z_{LOAD1}$) is greater than, preferably much greater than, the impedance of the mixer ($Z_{mixer}$) for connection to the first output 103, i.e. $Z_{LOAD1} \gg Z_{mixer}$. Further, the impedance of the second-branch load 410 ($Z_{LOAD2}$) is greater than, preferably much greater than, the impedance of the load 220 ($Z_{OIMC\_LOAD}$), i.e. $Z_{LOAD2} \gg Z_{OIMC\_LOAD}$. Further, the impedance of the load 220 ($Z_{OIMC\_LOAD}$) is greater than, preferably much greater than the impedance of the mixer ($Z_{mixer}$) for connection to the first output 103, $Z_{OIMC\_LOAD} \gg Z_{mixer}$. Further, $Z_{OIMC\_LOAD} \ll Zin\_det$, where Zin_det is the input impedance of the detector, and thus the load of the second output.

In this example, the first-branch and second-branch transistors are of nmos type but, in one or more other embodiments, may be of pmos type.

Figure 5:
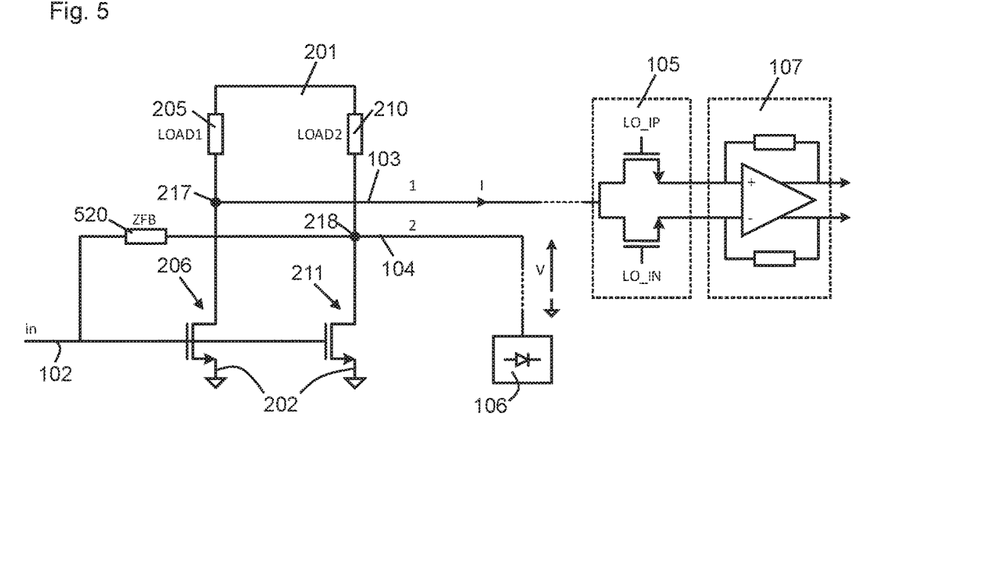
FIG. 5 shows a fourth example embodiment of the structure of the amplifier.

FIG. 5 shows an example embodiment similar to FIG. 2 and the same parts have been numbered with the same reference numerals. The example embodiment of FIG. 5 differs in that the impedance-modifying circuit comprises a feedback impedance 520 coupled between the input node 102 and the second output node 104, and in particular, to the node 218 as shown in FIG. 5. The feedback impedance 520 replaces and provides, at least in part, the function of the load 220 coupled to the second output 104. The feedback impedance 520 may also replace the matching impedance 108 and may thus provide the function thereof. Thus, the feedback impedance 520 may provide for one or both of input impedance matching for the amplifier 101 to a preceding block and modification of the voltage variation of the output signal of the amplifier at the second output terminal 104 relative to the first output terminal 103. In one or more examples, providing input-impedance matching with the feedback impedance 520 instead of the input resistance 108 of FIG. 2 may provide better noise handling for the wireless receiver 100. In other respects, the wireless signal receiver 100 may be similar to that of FIG. 2.

Accordingly, the provision of the feedback impedance 520 provides for, at least in part, the first output 102 having a current mode and the second output 103 having a voltage mode. Thus, the voltage variation of the second output signal provided at the second output terminal may be greater than the voltage variation of the first output signal provided at the first output terminal for a given input signal at the input terminal.

In one or more examples, the feedback impedance 520 may be provided instead of or in addition to the load 220 in the embodiment of FIG. 3 and FIG. 4. The feedback impedance 520 may also replace or be provided in addition to said matching impedance 108 of these examples.

The first output 103 can be considered to provide a current drive and the second output 104 can be considered to provide a voltage drive. In particular, the impedance of the first load 205 ($Z_{LOAD1}$) is greater than, preferably much greater than, the impedance of the mixer 105 ($Z_{mixer}$) for connection to the first output 103, i.e. $Z_{LOAD1} \gg Z_{mixer}$. Further, the impedance of the second load 210 ($Z_{LOAD2}$) is greater than, preferably much greater than, the impedance of the feedback impedance 520 ($Z_{FB}$), i.e. $Z_{LOAD2} \gg Z_{FB}$. Further, the impedance of the feedback impedance 220 ($Z_{FB}$) is greater than, preferably much greater than the impedance of the mixer ($Z_{mixer}$) for connection to the first output 103, $Z_{FB} \gg Z_{mixer}$. Further, $Z_{OIMC\_LOAD} \ll Zin\_det$, where Zin_det is the input impedance of the detector, and thus the load of the second output.

Figure 6:
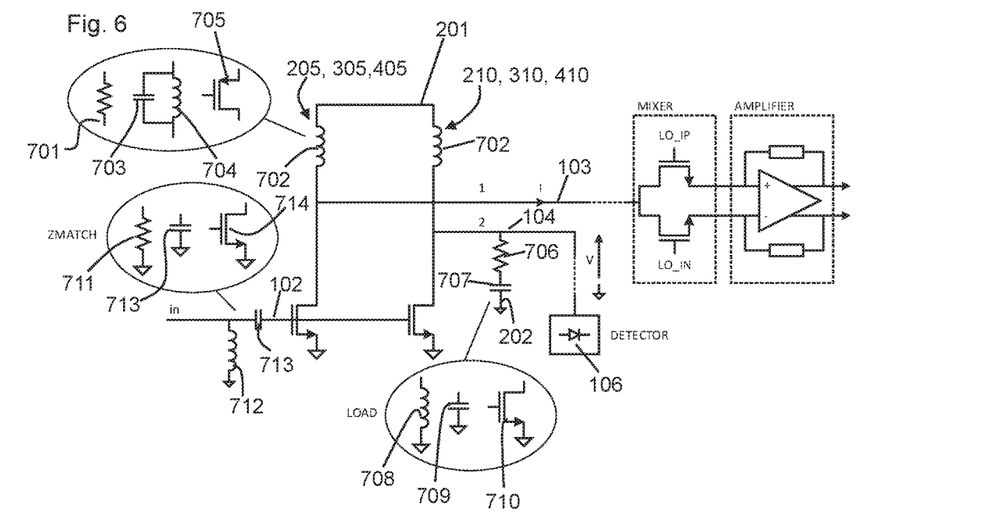
FIG. 6 shows examples of possible passive components to provide the first and second load, the matching impedance and the impedance-modifying circuit.

FIG. 6 illustrates that one or more of the first/first-branch load 205, 305, 405 and second/second-branch load 210, 310, 410 may be formed of one or more components. In particular, in one or more examples the first load and the second load or the first-branch load and second-branch load of the branches may comprise one or more of;
  i) one or more resistors 701;
  ii) one or more inductors 702;
  iii) one or more LC circuits comprising a capacitor 703 in parallel with an inductor 704;
  iv) one or more transistors 705.

When the impedance-modifying circuit comprises a load 220 coupled between the second output 104 and the reference voltage terminal 202 and in parallel with the second output 104, the load may comprise one or more of;
  i) one or more resistors 706 in series with one or more capacitors 707;
  ii) one or more inductors 708; and
  iii) one or more capacitors 709.

In one or more examples, where the input terminal 102 of the amplifier 101 includes a matching impedance 108 coupled in parallel therewith, the matching impedance 108 configured to match the input impedance of the amplifier 101 to the output impedance of a block providing the input signal to the input node, the matching impedance 108 may comprise one or more of;
  i) one or more resistors 711;
  ii) one or more inductors 712 coupled to the reference voltage terminal 202, e.g. ground, arranged in parallel with one or more capacitors 713, the capacitors 713 also coupled to the input node 102;
  iii) one or more capacitors 713;
  iv) one or more transistors 714.

The transistors 705, 710, 714 may be operated in the linear Ron region of their operation.

Figure 7:
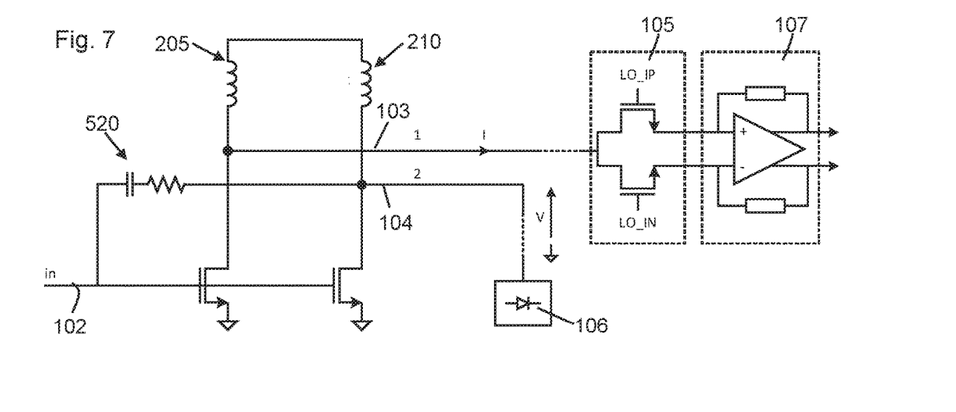
FIG. 7 shows an example implementation of the fourth example embodiment.

FIG. 7 is substantially similar to the embodiment of FIG. 5. In FIG. 7, the first load 205 is embodied as an inductor. The second load 210 may be embodied as an inductor. The feedback impedance 520 may be embodied as a capacitor in series with a resistor coupled between the input terminal 102 and the second output terminal 104.

As in any of the embodiments described herein, the first branch coupled between the supply voltage terminal 201 and the reference voltage terminal 202 may comprise a parallel arrangement of one or more further-first transistors and further-first loads arranged in parallel with the first load 205 and first transistor 206 (or just further-first transistors arranged in parallel with the first transistor). Further, as in any of the embodiments described herein, the second branch coupled between the supply voltage terminal 201 and the reference voltage terminal 202 may comprise a second parallel arrangement comprising one or more further-second transistors and further-second loads arranged in parallel with the second load 210 and second transistor 211 arranged in parallel (or just further-second transistors arranged in parallel with the second transistors). The different numbers of transistors/loads or transistors in each parallel arrangement may be used in order to optimize the power consumption of the amplifier 101.

Figure 8:
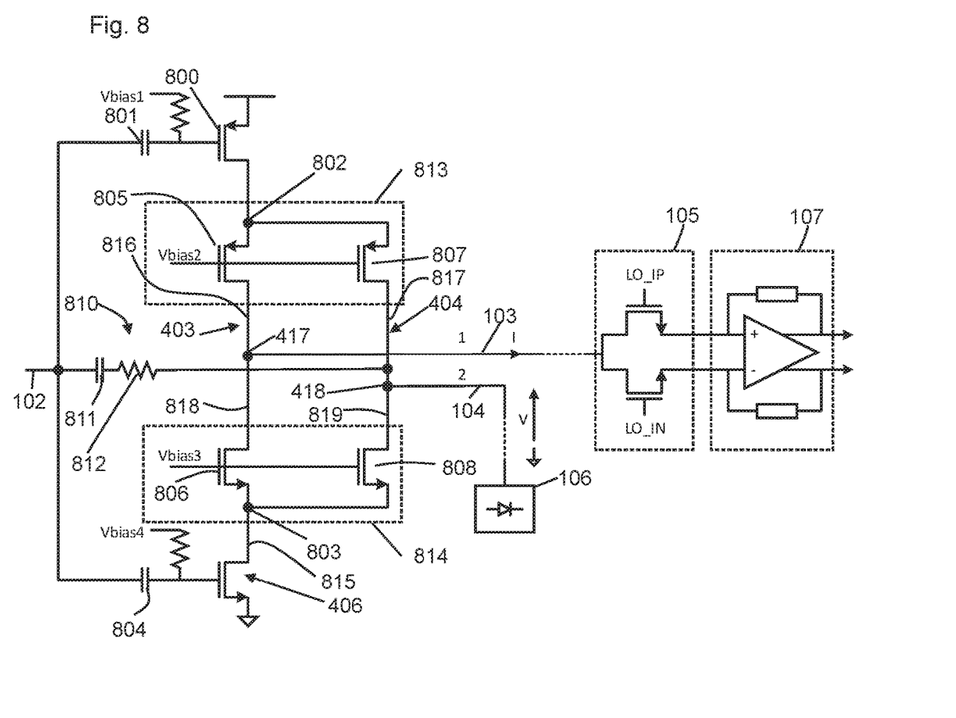
FIG. 8 shows a fifth example embodiment of the structure of the amplifier.

FIG. 8 shows a further embodiment based on the example embodiment of FIG. 4. This embodiment includes a second common, pmos, transistor 800 in addition to the first common transistor 406. The second common transistor 800 is coupled by its source terminal to the supply voltage terminal 201 and by its drain terminal to both of the first branch 403 and the second branch 404 at a node 802. A gate terminal of the second common, pmos, transistor 800 is coupled to the input node 102 via a capacitor 801. The gate terminal is further configured to receive a first bias voltage, Vbias1, via a resistor.

In this embodiment, the first branch 403 and the second branch 404 are both coupled, at node 803 to the source terminal of the common nmos transistor 406, as in the example of FIG. 4. The gate terminal of the common nmos transistor 406 is coupled to the input node 102 via a capacitor 804. The gate terminal is further configured to receive a fourth bias voltage, Vbias4, via a resistor.

The first branch includes 403 includes a third, pmos, transistor 805 and a fifth, nmos, transistor 806 (similar to the first-branch transistor of FIG. 4) arranged in series via their source and drain terminals. The second branch 404 includes a fourth, pmos, transistor 807 and a sixth, nmos, transistor 808 (similar to the second-branch transistor of FIG. 4) arranged in series via their source and drain terminals.

The third transistor 805 of pmos type is coupled by its source terminal to the drain terminal of the second common pmos transistor 800. The third transistor 805 is coupled by its drain terminal to the source terminal of the fifth, nmos, transistor 806. The drain terminal of the fifth transistor 806 is coupled to the node 803.

The fourth transistor 807 of pmos type is coupled by its source terminal to the drain terminal of the second common, pmos, transistor 800. The fourth transistor 807 is coupled by its drain terminal to the source terminal of the sixth, nmos, transistor 808. The drain terminal of the sixth transistor 808 is coupled to the node 803.

The third and fifth transistors 805, 807 may be configured to receive the same second bias voltage, Vbias2. The second bias voltage may not be based on the input signal.

The fourth and sixth transistors 806, 808 may be configured to receive the same third bias voltage, Vbias3. The third bias voltage may not be based on the input signal.

The drain terminal of the common transistor 406 is coupled to the reference voltage terminal 202. The source terminal is coupled to the node 803.

A feedback impedance 810 is coupled between the input node 102 and the second output terminal 104 and, in particular to a node between the fourth transistor 807 and the sixth transistor 808. In this example, the feedback impedance comprises a capacitor 811 and a resistor 812 in series.

The first and second branches therefore define a first current splitter 813 comprising the third and fourth transistors 805, 807 and a second current splitter 814 comprising the fifth and sixth transistors 806,808.

Thus, to summarise FIG. 8, the branches 403, 404 comprise a cascode based current splitter arrangement. Thus, the amplifier arrangement of this embodiment comprises a current-reuse amplifier or inverter style amplifier having two output terminals 103, 104 wherein the second output terminal is coupled to the impedance-modifying circuit 810.

Thus, in this example, the second common transistor 800 is coupled to the input terminal 102 and provides a first current in response the input signal at node 802 to the branches 403, 404. The common transistor 406 is coupled to the input terminal 102 and provides a second current in response the input signal at 815.

The first current splitter 813 has an input node comprising node 802 and first and second output nodes at 816 and 817 and, wherein the input node 802 receives the first current from the second common transistor 800 and the first and second output nodes 816, 817 output respectively a third and a fourth current in response to the first current.

The second current splitter 814 comprises an input node comprising node 803 and first and second output nodes 818 and 819, wherein the input node 803 of the second current splitter receives the second current and the first and second output nodes 818, 819 output respectively a fifth and a sixth current in response to the second current.

The first output terminal 103 is coupled to the node 417 and thus provides a signal having an output current substantially equal to the sum of the third and fifth currents.

The second output terminal 104 is coupled to the node 418 and therefore receives the fourth and sixth currents. The impedance-modifying circuit 810 is coupled to the second output terminal 104 for generating a voltage variation at the second output terminal 104 in response to the input signal and wherein the voltage variation at the second output terminal 104 is greater than a voltage variation at the first output terminal 103 in response to the input signal. Thus, the second output terminal 104 receives an output current based on the sum of the fourth and sixth currents modified by the impedance-modifying circuit 810.

In the above examples, the different embodiments of the structure of the amplifier 101 have been described. The wireless signal receiver 100 may comprise the amplifier 101 of any of the preceding example embodiments. The receiver 100 is configured to receive a wireless signal via an antenna (not shown) and provide said received signal as an input signal to the input node 102 for amplification by the amplifier 101 via none, one or more intermediate blocks. The wireless signal receiver may be configured to provide for processing of wireless signal in accordance with one or both of the IEEE 802.15.4 standard and the Bluetooth Low Energy standard. The receiver 100 may comprise the wireless signal power detector 106 for performing automatic gain control which is coupled to the second output node 104 and a mixer 105 coupled to the first output node 103 for processing of the received signal.

The output signal provided at each of the first and second output nodes 103, 104, being in current mode and in voltage mode respectively, may provide an advantageous signal for receipt by the mixer 105 and the power detector 106. The mixer 105 may operate more effectively when provided with an output signal in current mode, first output having a greater current for a given input signal than the second output. The power detector 106 may operate more effectively when provided with an output signal in voltage mode at the second output 104 as the voltage signal is stronger (has greater voltage variation than the first output signal at the first output terminal 103) for a given input signal for detection by the power detector 106 than the signal from the first output.

In one or more examples, the power detector 106 may be configured to provide a feedback signal based on the power of the signal received from the second output node, the feedback signal providing for automatic gain control of the amplification provided by the amplifier 101, the further amplifier 107 or any other amplifier that may form part of the receiver 100.

In each of the examples provided herein the mixer operates in current mode, and the output of the mixer 105 is electrically coupled to an input node 110 of the trans-impedance amplifier 107. The first output signal at the first output terminal 103 may have a greater current variation for a given input signal that the second output signal at the second output terminal 104. The amplifier 107 may comprise a differential amplifier. The trans-impedance amplifier 107 may comprise an output node 111 to provide an amplified (differential) output signal based on an input signal received at the input node 110 from the mixer 105. The amplifier 107 may have a feedback network 112 coupled between the output node 111 and the input node 110 of the trans-impedance amplifier.

The wireless signal receiver 100 may form part of an electronic device comprising any one of: a mobile telephone, a computer, a tablet computer, a wearable device, a sensor, a wireless headset.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

What is claimed is:

1. An amplifier comprising:
a supply voltage terminal for receiving a supply voltage;
a reference voltage terminal for receiving a reference voltage;
an input terminal configured to receive an input signal for amplification by the amplifier;
an amplifier arrangement comprising at least a first branch and a second branch coupled between the supply voltage terminal and the reference voltage terminal, the amplifier arrangement further comprising one or more transistors configured to provide current flow through each of the first and second branches based, at least in part, on the input signal at the input terminal;
a first output terminal coupled to a first node in the first branch configured to provide a first output signal based, at least in part, on the current flow therethrough; and
a second output terminal coupled to a second node in the second branch configured to provide a second output signal based, at least in part, on the current flow therethrough, wherein an impedance-modifying circuit is coupled to the second output terminal and configured to provide a voltage variation in the second output signal in response to the input signal such that the voltage variation in the second output signal is greater than a voltage variation in the first output signal in response to the input signal.

2. An amplifier according to claim 1, wherein
the first branch of the amplifier arrangement comprises a first transistor coupled to the input terminal to receive the input signal and coupled in series with a first load, the first transistor and first load configured to provide the first output signal in response to the input signal;
the second branch of the amplifier arrangement comprises a second transistor coupled with the input terminal to receive the input signal and coupled in series with a second load; and wherein
the first node is arranged between the first load and the first transistor to provide the first output signal to the first output terminal; and
the second node is arranged between the second load and the second transistor and configured to provide the second output signal modified by the impedance-modifying circuit.

3. The amplifier according to claim 2, wherein a) the first transistor and the second transistor or b) the first-branch transistor and the second-branch transistor are one of:
i) nmos type; and
ii) pmos type.

4. The amplifier according to claim 2, wherein the first transistor and the second transistor have different sizes.

5. The amplifier of claim 2 wherein the first load and the second load comprise one or more of:
i) one or more resistors;
ii) one or more inductors;
iii) one or more LC circuits comprising a capacitor in parallel with an inductor;
iv) one or more transistors.

6. An amplifier according to claim 1, wherein
the amplifier arrangement comprises:
a common transistor coupled to the input terminal to receive the input signal and coupled to both the first and second branches, the first branch having a first-branch transistor and a first-branch load arranged in series and the second branch having a second-branch transistor and a second-branch load arranged in series, wherein
the first node is arranged between the first-branch load and the first-branch transistor to provide the first output signal, and
the second node is arranged between the second-branch load and the second-branch transistor to provide the second output signal modified by the impedance-modifying circuit.

7. The amplifier of claim 1, wherein the impedance-modifying circuit comprises one or more of;
a) a load coupled between the second output and one of the reference voltage terminal and the supply voltage terminal, and in parallel with the second output; and
b) a feedback impedance coupled between the input terminal and the second output terminal.

8. The amplifier of claim 1 wherein the impedance-modifying circuit comprises a load coupled between the second output and one of the reference voltage terminal and the supply voltage terminal and in parallel with the second output, the load comprising one or more of;
i) one or more resistors in series with one or more capacitors;
ii) one or more inductors; and
iii) one or more capacitors.

9. The amplifier of claim 1, wherein the input terminal of the amplifier is coupled to a matching impedance coupled in parallel, the matching impedance configured to match the input impedance of the amplifier to the impedance of a block providing the input signal.

10. An amplifier according to claim 1, wherein
the amplifier arrangement comprises:
a first common transistor coupled to the input terminal to receive the input signal and coupled to both the first and second branches, the first branch having a third transistor and a fifth transistor arranged in series and the second branch having a fourth transistor and a sixth transistor arranged in series, wherein
the first node is arranged between the third transistor and the fifth transistor and configured to provide the first output signal, and
the second node is arranged between the fourth transistor and the sixth transistor and configured to provide the second output signal modified by the impedance-modifying circuit.

11. The amplifier of claim 10, wherein the amplifier arrangement includes a second common transistor coupled to the input terminal and coupled to both the first and second branches to control the current to the first and second branches in response to the input signal.

12. A wireless signal receiver comprising the amplifier of claim 1, the receiver configured to receive a wireless signal and provide said received signal to the input terminal for amplification by the amplifier, the receiver comprising a wireless signal power detector coupled to the second output terminal and a mixer coupled to the first output terminal for processing of the received signal.

13. A wireless signal receiver according to claim 12, wherein the receiver is configured to provide for processing of wireless signal in accordance with one or more of the IEEE 802.15.4 standard, IEEE 802.11 standard and the Bluetooth Low Energy standard.

14. A wireless signal receiver according to claim 12, wherein an output of the mixer is electrically coupled to an input node of a trans-impedance amplifier, the trans-impedance amplifier having an output node to provide an amplified output signal based on an input signal received at the input node from the mixer, the trans-impedance amplifier having a feedback network coupled between the output node and the input node of the trans-impedance amplifier.

15. An electronic device including the wireless signal receiver according claim 12, the electronic device comprising any one of: a mobile telephone, a computer, a tablet computer, a wearable device, a sensor, a wireless headset.

* * * * *